United States Patent
Hiskes et al.

[11] Patent Number: 5,942,284
[45] Date of Patent: Aug. 24, 1999

[54] GROWTH OF ELECTROLUMINESCENT PHOSPHORS BY MOCVD

[75] Inventors: Ronald Hiskes; Rene P. Helbing, both of Palo Alto; Stephen A. DiCarolis, Santa Clara, all of Calif.

[73] Assignee: Hewlett-Packard Company, Palo Alto, Calif.

[21] Appl. No.: 08/757,864

[22] Filed: Nov. 27, 1996

[51] Int. Cl.[6] .................................................. C23C 16/00
[52] U.S. Cl. ........................................ 427/255.6; 117/104
[58] Field of Search ..................................... 427/249, 250, 427/255, 255.1, 255.6; 438/681, 711, 725; 117/104

[56] References Cited

PUBLICATIONS

Bessergenev, V. G., et al., "Optical and Structural Proper Ties to ZNS and ZnS:Mn Films Prepared by CVD Method", Materials Research Bulletin, vol. 30, No. 11, 1995, pp. 1393–1400.

Lovergine, N. et al., "Metalorganic Vapour Phase Epitaxy Growth of ZnS Layers by (t–BuOSH and Me2Zn:Et3N Precursors", Journal of Crystal Growth, vol. 156, 1995, pp. 45–51.

Helbing, R. et al., "Growth of CaS Thin Films by Solid Source Metalorganic Chemical Vapor Deposition", Journal of Crystal Growth, vol. 146, 1995, pp. 599–603.

*Primary Examiner*—Felisa Hiteshew

[57] ABSTRACT

A method for depositing a thin film including a sulfide of a metal on a substrate. First and second vapor streams are generated and combined in the vicinity of the substrate. The first vapor stream includes an organic compound containing the metal is generated. The second vapor stream includes a mercaptan. The preferred mercaptan is tertrary-butyl-mercaptan. The preferred metal precursor is a β-diketonate of the metal.

3 Claims, 1 Drawing Sheet

GROWTH OF ELECTROLUMINESCENT PHOSPHORS BY MOCVD

FIELD OF THE INVENTION

The present invention relates to phosphors for use in display devices, and more particularly, to an improved system for depositing sulfides of metals.

BACKGROUND OF THE INVENTION

Alkaline earth sulfides, doped with rare earth ions, are the basis of a large class of electroluminescent displays. Traditionally, thin films of alkaline earth sulfides have been prepared by sputtering, evaporation, or metal organic chemical vapor deposition (MOCVD). Sputtered films suffer from a substantial amount of nonstoichiometry. To overcome this nonstoichiometry, sulfur co-evaporation and sputtering in a reactive atmosphere ($H_2S$) must be used to improve the quality of the layers.

MOCVD techniques that overcome the problems encountered with sputtering have shown promise for growing layers of alkaline earth sulfides. However, these techniques grow a film one layer at a time. Each monolayer is deposited is a sequence of steps. For example, to deposit a layer of ZnS or SrS on a substrate, dimethylzinc is introduced in the vapor phase over the substrate and forms zinc bonds on the substrate surface. The source of dimethylzinc vapor is then turned off and excess unreacted dimethylzinc is removed from the reactor by $H_2$ gas purge. $H_2S$ is then introduced into the reactor and reacts with the dimethylzinc that was absorbed onto the substrate to form a layer of ZnS. The excess $H_2S$ is then purged and the cycle repeated. To grow a layer with a useful thickness, hundreds of cycles are needed. Hence, this method is poorly suited to large scale protection of display devices. In addition, the method requires $H_2S$ which is a highly toxic compound, and hence, is to be avoided if possible.

Broadly, it is the object of the present invention to provide an improved method for a depositing layer of metal sulfide.

It is a further object of the present invention to provide a method for depositing a layer of an alkaline earth sulfide by a continuous deposition process that does not require a large number of repeated cycles.

It is a still further object of the present invention to provide a method for depositing a layer of alkaline earth sulfide that does not require the use of $H_2S$.

These and other objects of the present invention will become apparent to those skilled in the art from the following detailed description of the invention and the accompanying drawings.

SUMMARY OF THE INVENTION

The present invention is a method for depositing a thin film including a sulfide of a metal on a substrate. First and second vapor streams are generated and combined in the vicinity of the substrate. The first vapor stream includes an organic compound containing the metal. The second vapor stream includes a mercaptan. The preferred mercaptan is tertrary-butyl-mercaptan. The preferred metal precursor is a β-diketonate of the metal.

DETAILED DESCRIPTION OF THE INVENTION

Figure 1:
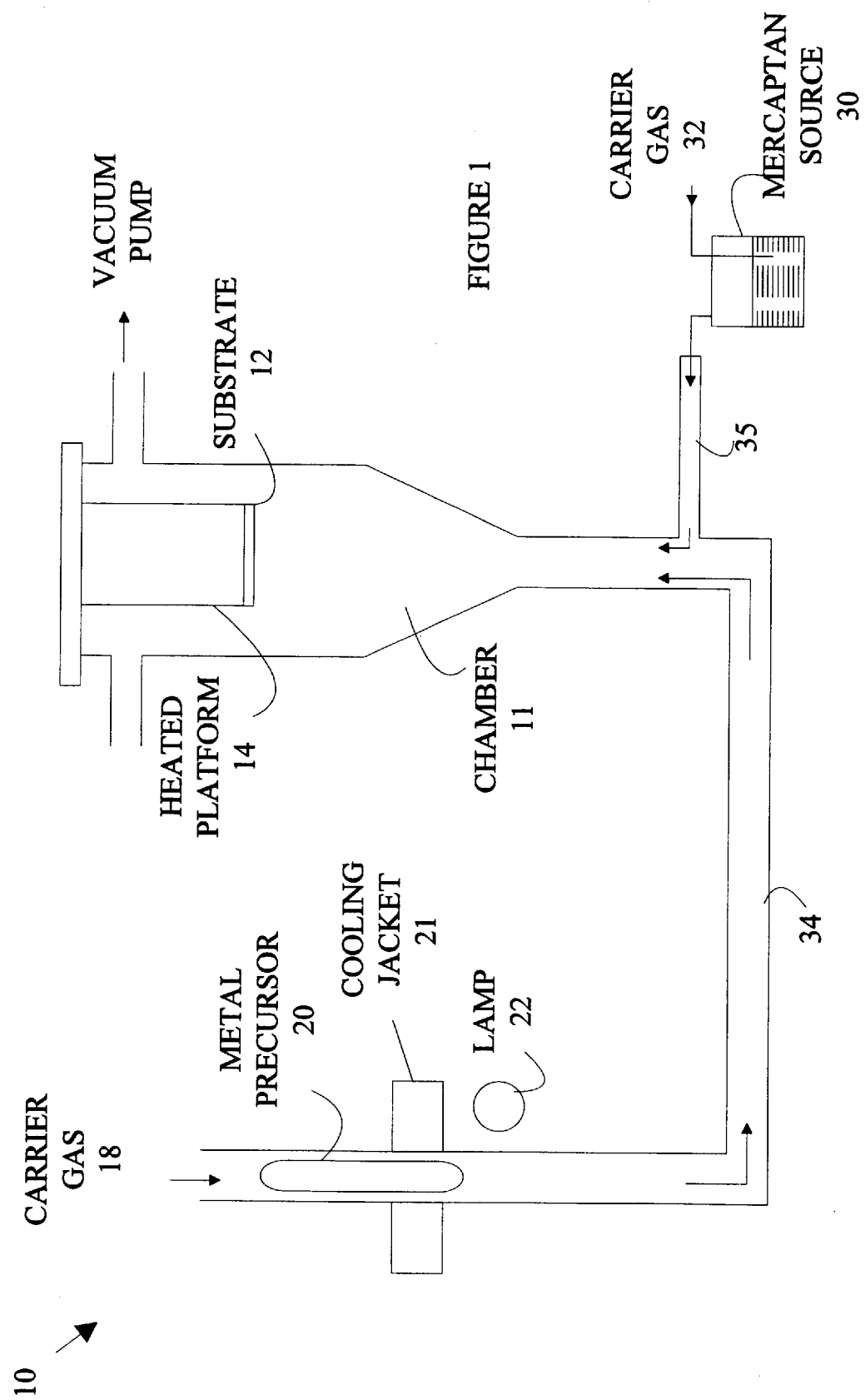
FIG. 1 is a schematic drawing of a deposition apparatus in which the present invention may be practiced.

The present invention may be more easily understood with reference to FIG. 1 which is a schematic view of a MOCVD apparatus 10 that may be used to practice the present invention. The alkaline metal sulfide is generated by a chemical reaction between an organic metal precursor 20 and an organic sulfur precursor 30. The preferred metal precursor is a β-diketonate of the metal. The sulfur source is an organic mercaptan. The chemical reactions that lead to the deposition of the metal sulfide on the substrate 12 are as follows:

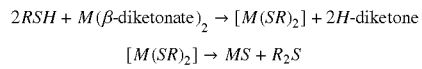

Here, M is the metal and R is any organic compound.

The metal precursor is typically a packed powder that includes any dopants needed in the final film. The precursor is vaporized by a lamp 22 that heats the end of a powder rod. The remainder of the powder source is protected from vaporization by a cooling jacket 21. As the end of the powder source is expended, the powder rod is moved downward to present additional material to the lamp.

The vaporized metal precursor, at about 230° C. to 260° C., is captured by a carrier gas stream 18 to form a first vapor stream 34 which carries the vapor into chamber 11. The sulfur precursor is preferably a liquid which is evaporated into a second carrier gas stream 32 from a source 30 to form a second vapor stream 35. The vaporized sulfur precursor is likewise carried into chamber 11 which is typically held at a pressure of 30 Torr. The precursors react over the substrate 12 which is held at approximately 375° C. to 525° C. with the aid of heated platform 14.

The preferred mercaptan is t-butyl mercaptan (alkane thiol). This compound is less toxic than $H_2S$. In addition, this compound is used as an ordorizing agent in natural gas; hence, any leakage of the compound can be easily detected by its odor. The compound is also quite inexpensive because of its bulk use as an additive to natural gas.

While the preferred mercaptan is as described above, it will be apparent to those skilled in the art that there are a large number of possible mercaptans that can function satisfactorily as the sulfur source. For example, Ethanethiol, 1-propanethiol, 2-propanethiol, 1-Butanethiol, 2Methyl-1-butanethiol, 2-Methyl-2-butanethiol, 2-mercaptopyridine, 4-mercaptopyridine, 2mercapto-1-methylimidazole, and 5-mercapto-1-methyltetrazole may also be used in place of tertrary-butyl-mercaptan.

It should be noted that gas phase pre-reaction does not occur using the metal-diketonate and mercaptan sources of the present invention. Hence, the process may be practiced as a continuous deposition process.

Various modifications to the present invention will become apparent to those skilled in the art from the foregoing description and accompanying drawings. Accordingly, the present invention is to be limited solely by the scope of the following claims.

What is claimed is:

1. A method for depositing a thin film, including a sulfide of a metal, on a substrate, said method comprising the steps of:

generating a first vapor stream comprising an organic compound containing said metal;

generating a second vapor stream comprising a mercaptan; and mixing first and second streams in the vicinity of said substrate, said substrate being held at a temperature at which said sulfide of said metal will form on said substrate, wherein said mercaptan is tertrary-butyl-mercaptan.

2. A method for depositing a thin film, including a sulfide of a metal, on a substrate, said method comprising the steps of:

generating a first vapor stream comprising an organic compound containing said metal;

generating a second vapor stream comprising a mercaptan; and mixing first and second streams in the vicinity of said substrate, said substrate being held at a temperature at which said sulfide of said metal will form on said substrate, wherein said mercaptan is selected from the group consisting of Ethanethiol, 1-propanethiol, 2-propanethiol, 1-Butanethiol, 2-Methyl-1-butanethiol, 2-Methyl-2-butanethiol, 2-mercaptopyridine, 4-mercaptopyridine, 2-mercapto-1-methylimidazole, and 5-mercapto-1-methyltetrazole.

3. A method for depositing a thin film, including a sulfide of a metal, on a substrate, said method comprising the steps of:

generating a first vapor stream comprising an organic compound containing said metal;

generating a second vapor stream comprising a mercaptan; and mixing first and second streams in the vicinity of said substrate, said substrate being held at a temperature at which said sulfide of said metal will form on said substrate, wherein said organic compound containing said metal is a $\beta$-diketonate of said metal.

* * * * *